(12) United States Patent
Kinder

(10) Patent No.: US 6,894,406 B2
(45) Date of Patent: May 17, 2005

(54) SUPERCONDUCTING SWITCHING ELEMENT AND METHOD

(75) Inventor: Helmut Kinder, Freising (DE)

(73) Assignee: Theva Dunnschichttechnik GmbH, Eching-Dietersheim (DE)

( * ) Notice: Subject to any disclaimer, the term of this patent is extended or adjusted under 35 U.S.C. 154(b) by 154 days.

(21) Appl. No.: 09/854,422

(22) Filed: May 11, 2001

(65) Prior Publication Data

US 2002/0017970 A1 Feb. 14, 2002

(30) Foreign Application Priority Data

May 15, 2000 (DE) .......................................... 100 23 547

(51) Int. Cl.[7] ................................................ H01H 3/00
(52) U.S. Cl. ........................ 307/139; 307/125; 335/216
(58) Field of Search ................................ 307/125, 139; 335/216

(56) References Cited

U.S. PATENT DOCUMENTS

| | | | | | |
|---|---|---|---|---|---|
| 3,732,438 | A | * | 5/1973 | Wright | 307/245 |
| 3,835,369 | A | * | 9/1974 | Zoleta | 323/44 |
| 3,956,727 | A | * | 5/1976 | Wolf | 338/32 S |
| 4,897,558 | A | * | 1/1990 | Tidman | 307/245 |
| 5,286,710 | A |   | 2/1994 | Hascicek et al. | |
| 6,317,303 | B1 | * | 11/2001 | Zeigler et al. | 361/19 |

FOREIGN PATENT DOCUMENTS

| | | | | |
|---|---|---|---|---|
| DE | 198 56 425 A1 | 7/1999 | | |
| DE | 198 56 425 A1 | 9/1999 | | |
| DE | 198 32 273 C1 | 11/1999 | | |
| DE | 198 27 225 C1 | 12/1999 | | |
| DE | 19928324 A | * 12/2000 | ........... | H01L/35/16 |
| EP | 0 074 030 | 3/1983 | | |
| EP | 0 206 395 | 12/1986 | | |
| GB | 1 004 178 | 9/1965 | | |
| GB | 1 052 828 | 12/1966 | | |
| GB | 1 175 091 | 12/1969 | | |
| GB | 1 351 969 | 5/1974 | | |
| GB | 2 272 111 | 5/1994 | | |
| JP | 09129939 A | * 5/1997 | ........... | H01H/33/00 |
| JP | 2001332775 | * 11/2000 | ........... | H01L/39/16 |

* cited by examiner

Primary Examiner—Robert DeBeradinis
(74) Attorney, Agent, or Firm—Renner, Otto, Boisselle & Sklar, LLP

(57) ABSTRACT

The invention relates to a switching element for modifying the electric resistance with at least one high temperature superconductor (1) and means (3) for irradiating electromagnetic high frequency onto the at least one high temperature superconductor (1). The invention further relates to a method for switching a high temperature superconductor (1) comprising the steps of providing a high temperature superconductor (1) in the superconducting state and irradiating an electromagnetic high frequency until the high temperature superconductor (1) changes over into a normally conducting state.

Figure 1:
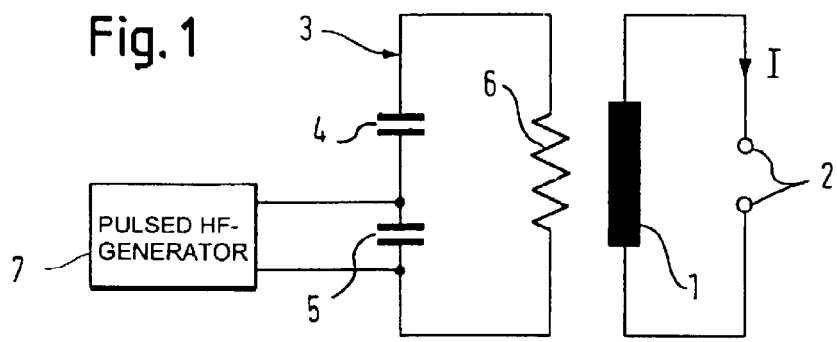

30 Claims, 3 Drawing Sheets a b

SUPERCONDUCTING SWITCHING ELEMENT AND METHOD

TECHNICAL FIELD

The invention relates to a superconducting switching element and a method for its intentional switching.

THE PRIOR ART

Superconducting switching elements, which can be selectively switched in a very short time from a superconducting state into a normal state, can be used in high power electronics for a large number of devices, in particular, if the electric strength of semiconductor elements is not sufficient or the time constants of conventional switches are too high. Examples of such devices, the function of which can be improved by superconducting power switches, are current limiters, rectifiers, inverted rectifiers, high field magnets and magnetic energy storages.

Superconducting switches have already been described on the basis of classic metallic superconductors like niobate etc. However, since these classical superconductors are also very good normal conductors having a very low resistance, the height of the increase of the resistance during switching is very low. Accordingly, a lot of material must be used, for example in the form of a long wire wound to a coil to obtain a significant increase of the resistance in the electric circuit. The amount of the required material, however, leads to a very high thermal inertia and the switch requires a long recooling time (several ten seconds up to minutes) until it can be operated again.

High temperature superconductors are in contrast thereto poor conductors in the normal state. In the form of thin films on a carrying substrate, the thermal time constant is lower by orders of magnitude (in the range of milliseconds). For this reason resistive switches on the basis of thin HTS layers are of high interest for the above described applications.

Superconducting switching elements consist typically of a conductor of high temperature superconducting material which is deposited onto a carrying substrate by means of thin film techniques and which is structured into suitable conducting paths by means of photolithography. Such a conductor is electrically contacted at its ends and inserted into an electric circuit. The superconductor is cooled to a temperature below its critical transition temperature so that the nominal current can flow through the superconductor without ohmic losses. If the transported current exceeds the nominal current, for example in case of a short in the circuit, or if the current carrying capability is artificially reduced by an external influence, the superconductor switches from the superconducting state over to the normal conducting state, since the superconductor loses its superconducting property, if the critical current is exceeded. Due to the arising high resistance, the short circuit current is limited or can be directed into a parallel branch in the electric circuit. This switching process occurs within fractions of a millisecond up to a few milliseconds.

If the switching element is added in series to an electric circuit, it can be used as a resistive current limiter. Such current limiters are known from the DE 198 27 225 and the DE 198 32 273. Due to its short response time and the limitation of the maximal current, all other operating means, which are arranged in the electric circuit, are substantially less loaded. The switch acts as a self-triggering fuse. After the short circuit has been removed by means of conventional switches, the superconductor can recool and is available for a new switching process.

If the switch can be selectively triggered, the suddenly occurring resistance can also be used for switching the current flow into a parallel line of a lower ohmic resistance. The switch acts in this case not as a fuse but as switchable points. Due to the fast response time and the low thermal inertia of the thin film conductor, these points can also be used to periodically switch an alternating current of low frequency, as for example the 50 or 60 Hz net frequency.

Also in the case of a resistive current limiter switching on its own according to the above described principle and not requiring an active control, such a control is nevertheless desirable. The reason is that the superconductor changes only under ideal circumstances simultaneously over its complete length into the normal conducting state. In practice, the switching process always starts at the weakest point caused by the imhomogenity of the material. Since the complete dissipated energy arises instantaneously locally in this narrowly limited area, a so-called "hot spot" can form by local overheating. Due to a positive feedback, the area continues to heat up until the material is destroyed by heating. For this reason measures are taken in known current limiters to prevent the "hot spot"-formation. One example for these measures is to deposit a metallic parallel conductor ("shunt") onto the superconductor. Such arrangements are described in the DE 198 56 425 and the above mentioned patents. A major disadvantage of this "shunt"-layer, however, is that the resistance in the normal conducting state is in the case of triggering the switch no longer exclusively determined by the superconductor but essentially by the metallic "shunt"-layer, whereby the maximally switchable power (the product of current prior to switching and voltage drop after switching) is drastically reduced. If it is possible to simultaneously switch the superconductor in a large area, the "hot spot"-problem is no longer present and there is no need for the shunt-layer.

It is known that the superconductor can be heated above its critical temperature by a heater arranged on the substrate using a current pulse so that the switching process can be triggered. Resistively heated thin metallic layers, for example made out of constantan, can be used. However, it is a disadvantage of this method that considerably high heating powers are necessary. In the case of a high temperature superconductor, the operating temperature is typically above 40 K, preferably close to the boiling temperature of liquid nitrogen at approximately 77 K. In this temperature region heat is distributed through the substrate by diffusion, i.e. the heating pulse must at first fill the—compared to the superconducting film—huge heat capacity of the substrate. The necessary heater power is therefore considerably higher than necessary for triggering the superconductor alone. Furthermore, the added heat increases the recooling time of the switch into the superconducting state. Therefore, this way of triggering is not suitable for fast periodic switching processes.

Further it is known that the critical current can be suppressed in classical metallic superconductors by applying a magnetic field so that the switching process can be triggered. This method, however, is not practicable in the case of epitactically grown high temperature superconductor layers due to the necessary high critical field strength.

It is therefore the problem of the present invention to actively control the switching process and to simultaneously trigger it in a large area in a way that the described disadvantages of the prior art are overcome. This allows on the one hand to solve the problem of local overheating, on the other hand there are completely new fields of application for such a switching element due to the fast, selective triggering.

SUMMARY OF THE INVENTION

This problem is solved by a switching element with a high temperature superconductor and an irradiating assembly for irradiating electromagnetic energy onto the high temperature semiconductor. Another aspect of the invention is directed to a method of switching a high temperature superconductor that includes providing the high temperature superconductor in a superconducting state and irradiating the high temperature superconductor with electromagnetic energy until the high temperature superconductor switches into a normal conducting state.

According to the invention, the triggering of the switching process in a current-carrying superconductor is made possible by irradiation of electromagnetic high frequency having preferably a comparatively low power. The quickly changing field can directly couple to the superconductor and induces a resistance in the superconducting layer which is further amplified by the transport current, until the superconductor becomes normally conductive.

Preferably, the field is irradiated in the form of high frequent pulses of a fixed frequency. The same effects, however, can be obtained with fields consisting of different frequencies. Accordingly, the triggering is not limited to pure high frequent sinusoidal oscillations but can be generally obtained by signals changing in time having high frequent Fourier components which are equivalent to the stimulating frequencies described below. The time length of the high frequency irradiation is only relevant insofar that it must be long enough to trigger the switching process.

Further preferred embodiments and applications of the switching element according to the invention as well as of the corresponding method are the subject-matter of further dependent claims.

SHORT DESCRIPTION OF THE DRAWING

In the following the typical construction for a controlled triggering of superconducting switching elements is exemplary presented. The following drawings serve for illustration:

FIG. 1: Schematic assembly of a controllable switching element. The switching element consists of a superconducting strip conductor 1 deposited onto a substrate. This element is inserted in series into an electric circuit and carries a current I. The source of the current 2 can be a direct currency source, an alternating currency source or any other current source. The oscillating circuit 3 for creating the high frequency consists of the capacitors 4 and 5 and the coil 6 which is positioned close to the superconductor. By means of a pulsed HF-generator 7 the high frequency is coupled via the capacitor 4 into the oscillating circuit. The coupling of the high frequency can also be achieved by other methods common in the art. The time length of the pulse can be adjusted at the generator 7. Instead of a generator, also a self stimulating circuit can be used.

FIGS. 2a–e: Different possible embodiments of flat coils 6 for coupling the magnetic field into the superconductor 1. The number of windings of the coil varies depending on the size of the area to be switched or the inductivity necessary for the oscillating circuit 3.

Figure 3:
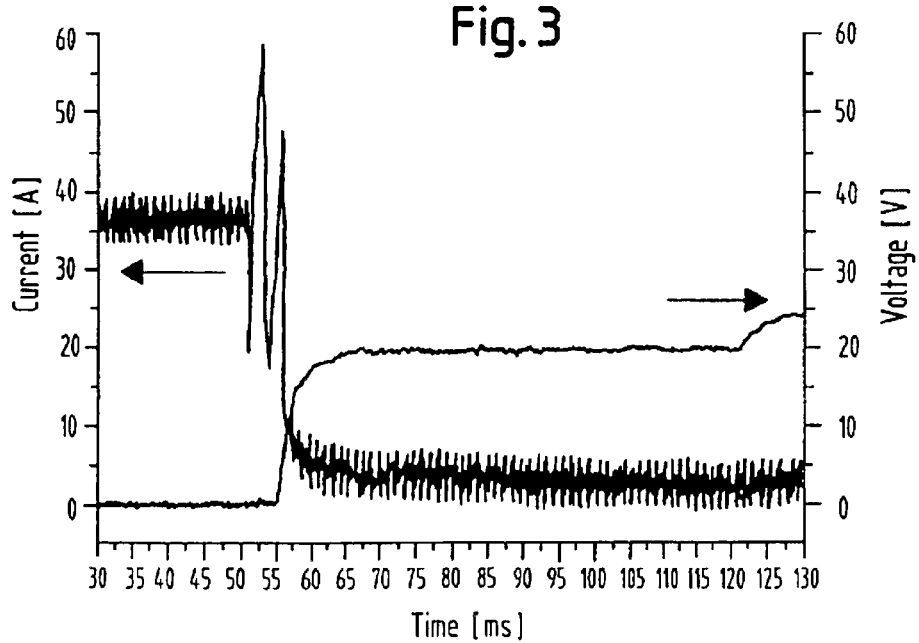

FIG. 3: Time dependency of current and voltage over the superconducting switch operated as a resistive current limiter. At first an initial current of approximately 36 A was applied to the superconductor. Subsequently, the superconductor was subjected to a high frequency pulse of 23 MHz with an output power of 11 W of 5 ms. Thus, a switching process was triggered and the current limited to approximately 15% of the initial current.

Figure 4:
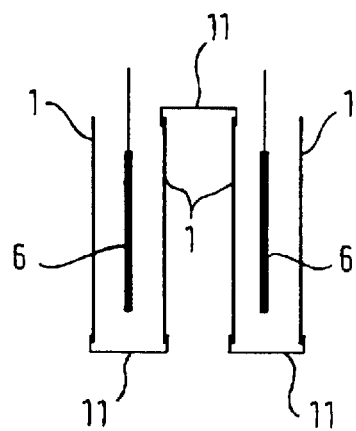
Figure 4:
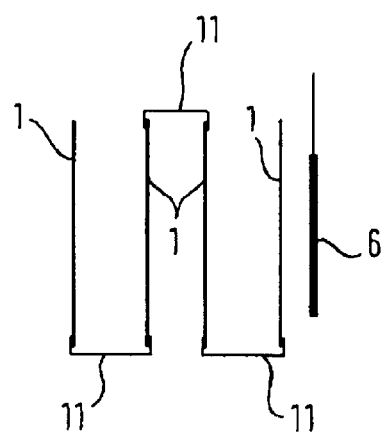

FIG. 4: Schematic construction for triggering a stack of superconducting switching elements 1. The single superconducting elements are connected to each other via contacting lines 11. (a) Between a pair of plates there is a respective coil 6 of the oscillating circuit triggering the two adjacent plates. (b) In case of a sufficiently high HF-power, a complete stack of several superconducting elements 1 can be triggered.

Figure 5:
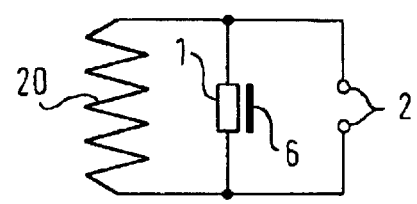

FIG. 5: Arrangement for the fast decoupling of energy from a magnetic energy storage. The storage consists of the high field coil 20 which is shorted via the switching element 1 and in which a permanent current circulates. A consumer can be connected to the contacts 2 which is during normal operation supplied by the mains supply. In case of a short interruption of the mains supply which would substantially interfere with the consumer, the switching element 1 is triggered and the current is available at the contacts for smoothing the interference of the mains supply. In general such an arrangement can be used for creating high power, direct currency pulses.

Figure 6:
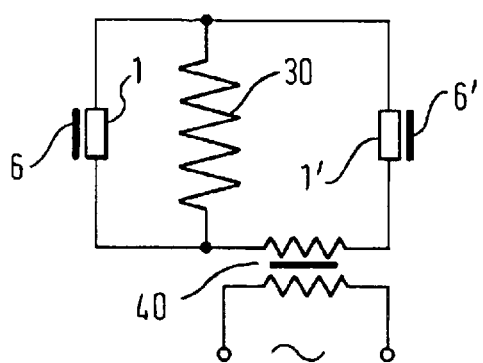

FIG. 6: Two switching elements 1 and 1' are arranged in an electric circuit each in parallel to a consumer 30, which can be a magnetic coil or any other ohmic consumer. At a parallel circuit current can be coupled into from the outside via a transformer 40. In case of the consumer being a superconducting magnet this arrangement can be operated as a flow pump. In case of another consumer this is called a controlled rectifier.

Figure 7A:
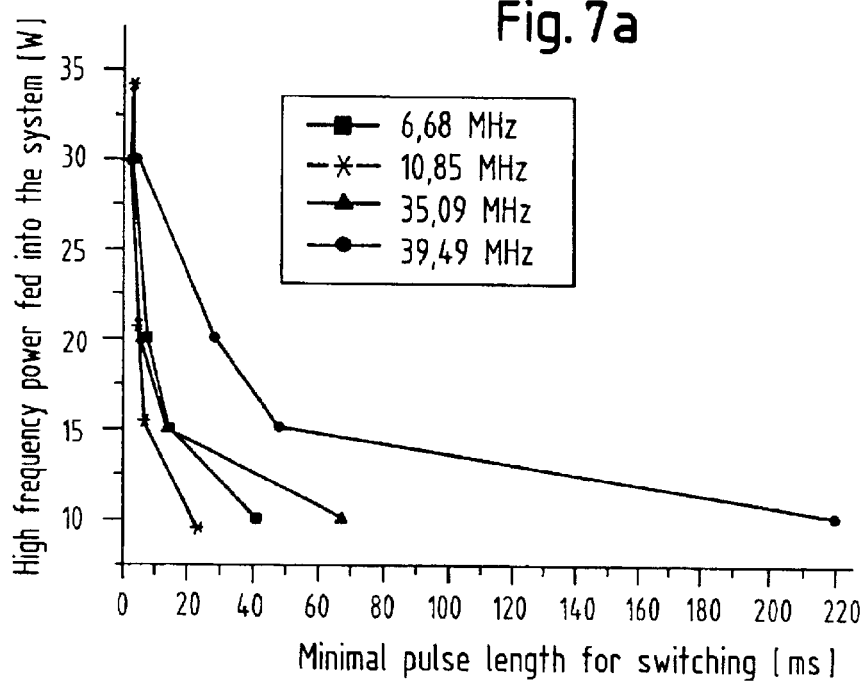

FIGS. 7a, b: Relation between irradiated power and switching time for different high frequencies in the MHz-range.

DETAILED DESCRIPTION

The superconducting switching element consists according to FIG. 1 of a thin high temperature superconductor film on a substrate structured into a strip conductor 1 and contacted at its ends. It is inserted in series into an electric circuit. Close to the superconductor 1 a coil 6 is arranged having preferably a planar shape, which is isolated from the superconductor for example by a thin Kapton film. For cooling the assembly, it can be arranged for example in a PVC-reservoir filled with liquid nitrogen.

Figure 2:
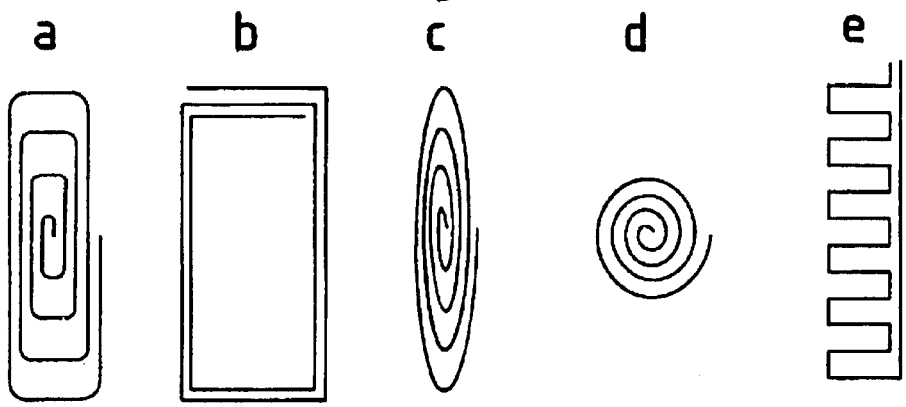

Different embodiments of the coupling coil are exemplary shown in FIG. 2. The coil can be wound as a flat coil out of copper, silver-plated copper wire or silver wire or a high frequency stranded wire, it can be structured in layer technique onto the backside of a substrate or be manufactured from the copper coated conductor plate (Pertinax, epoxy resin-fiber glass laminate).

In a particular preferred embodiment a 35 $\mu$m thick conductor coil made out of copper is used. It is structured by means of photolithography from a 1.4 mm thick conductor path on epoxy resin fiber glass laminate FR4. Exemplary dimensions of the coil are in the range of 10 mm×40 mm.

Preferably, the coil can also consist of superconducting material in order to obtain a high Q of the oscillating circuit and thus a low switching power. The coil is either directly supplied via a pulsed high frequency generator or it is, as shown in the example of FIG. 1, part of an oscillating circuit 3, which is fed from a frequency generator 7 with high frequency pulses (time length 1 $\mu$s to 1 s), or it oscillates on its own. The coupling into the oscillating circuit can be achieved, as shown, via a capacitor 5 or any other common ways, for example inductively. In the case of the shown arrangement of an oscillating circuit, the overall capacity is tuned to the desired resonance frequency of the oscillating circuit.

The used frequencies are preferably in the MHz-range and should preferably not exceed 200 MHz, since the major part of the power is at higher frequencies released as electromagnetic waves and not available for switching which requires high output powers at the frequency generators.

Figure 7B:
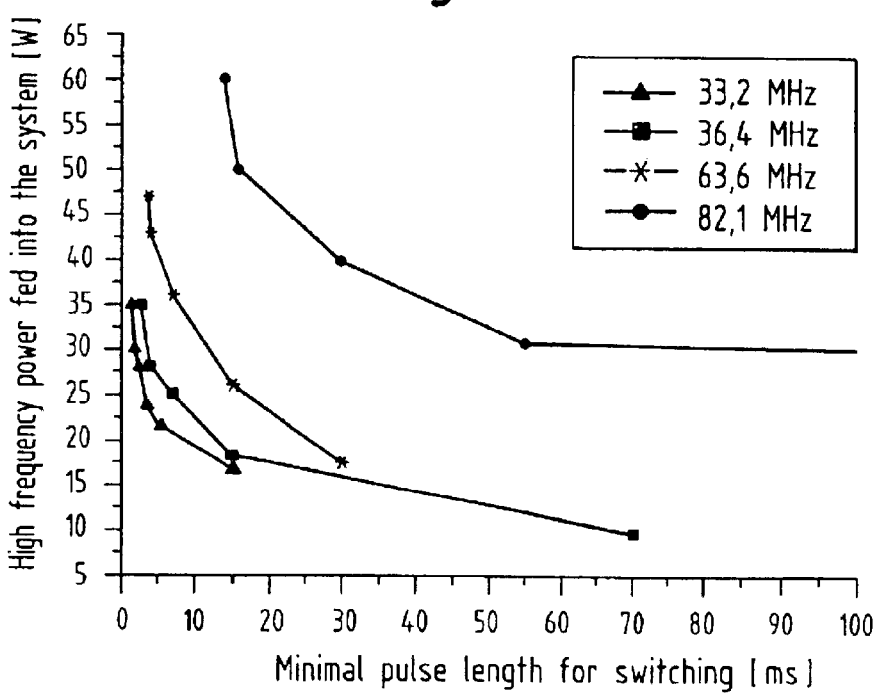

The high frequency power $P_{into}$ fed into the oscillating circuit versus the switching time at different frequencies is shown for two different measurements in the FIGS. 7a and 7b. These measurements were performed with the same sample (switching currency $I_s$=34 A), however, using different initial currents of 26 A (FIG. 7a) and 22 A (FIG. 7b) (voltage source: Battery). The smallest switching times are achieved at a frequency of approximately 10 MHz. At higher powers $P_{into}$ the switching time of the different frequencies approach each other more and more. Prior measurements up to 800 MHz confirm that a switching with higher frequency requires a longer pulse length or a higher power, as already indicated up to 80 MHz. Frequencies above 100 MHz are therefore not to be reasonably used as switching frequencies. This also seems to apply for frequencies below 10 MHz. In general an essentially exponential relation between the power and the switching time is found.

There are two operating modes for the superconducting switching element:
1. The switch is heated after triggering by the current flowing through, the superconductor remains in the resistive state until the flow of current is interrupted somewhere else and the superconductor can cool down.
2. The switch is triggered by the HF-power coupled into, however, the dissipated energy caused by the current flowing through is less than the cooling power of the carrying-off of heat. The flow of current is not sufficient to keep the superconductor in the resistive state. Once the HF-signal is turned off, the switch cools down and becomes superconducting again. This operating mode may for example be present, if there is a low ohmic conductor parallel to the switch.

EXAMPLES

Example 1

The actively triggered superconducting switching element 1 consists of a 4 cm long and 1 cm wide YBCO-film ($YBa_2Cu_3O_{7-\delta}$) having a thickness of 300 nm, which is epitactically deposited onto a sapphire substrate. The superconducting ridge is subjected to an initial current of 36 A. The coupling coil 6 for the high frequency consists of a flat coil according to FIG. 2b with 11 windings and an inductivity of 1.5 $\mu$H. It covers the ridge almost completely. The switching process can be recognized in FIG. 3 by a voltage increase and a current drop. The current is limited to approx. 15% of the initial current.

Example 2

The actively triggered superconducting current limiter 1 is inserted in series into an electric circuit. If a strong current increase exceeding the nominal current—for example due to a short circuit—is detected, the short circuit current can be limited by the active triggering of all superconducting elements without the occurrence of a hot spot. The limitation to approximately the nominal current takes place within a few milliseconds. The HF coil 6 must not necessarily cover the complete superconductor 1 but can be limited to parts of preferably a few millimeter length. If such a macroscopic area has switched, a hot spot can no longer form and the quench is distributed over the conductor with speeds between 10 and 100 m/s. The switching length depends on the maximal voltage of the outer circuit.

Example 3

A superconducting magnetic energy storage (SMES) consists of a superconducting coil 20 creating a high magnetic field which is shorted according to FIG. 5 via a superconducting switch 1 of the above construction. In order to decouple energy from the system, the superconducting element 1 is switched by means of the high frequency pulse into the normal conducting state. The superconducting switching element 1 acts as points for the current. During the time period of the HF-pulse the stored energy is available at the contacts 2, that is, for an external consumer for a time period of typically a few milliseconds. When the HF-pulse is turned off, the superconductor 1 falls back into the superconducting state and the energy storage is shorted again. This arrangement serves to buffer short voltage fluctuations in the external electric circuit, which is very important for the operation of sensitive systems, for example in the semiconductor or paper production.

Example 4

Two or more actively triggered superconducting switches 1, 1' are used for operating a flow pump by switching in antiphase (cf. FIG. 6). Such flow pumps serve for loading a great inductivity with a high current. The alternating current fed via the transformer 40 into the superconducting circuit is switched by the alternating opening and closing of the switches 1 and 1' so that as a net result the current in the magnet 30 is stepwise increased. For a pumping frequency of 20 Hz at first a closing time of the switch of 15 ms is necessary which can easily be achieved with the switching element 1, 1' according to the invention.

Example 5

Two or more actively triggered superconducting switches 1, 1' are used for rectifying an alternating current by switching in antiphase. An exemplary circuit is shown in FIG. 6 and can be operated in the same manner as the flow pump (example 4). However, instead of the magnetic coil 30 there is a consumer 30 for direct current provided.

Example 6

If in Example 5 or FIG. 6 the functions of consumer and current source are exchange, the assembly can be used as an inverted rectifier. A direct voltage fed into the system at the position 30 is transformed into alternating voltage at the output 40 by a periodic switching of the switches 1 and 1' in antiphase.

The examples 4 to 6 have in common that the primary circuit with an alternating current is only inductively coupled to the superconducting, that is, cooled secondary circuit. Thus, both circuits can be easily thermally decoupled so that there is no undesired heat flow via the contacts into the cooled area.

What is claimed is:
1. Switching element for modifying the electric resistance comprising:
   a. at least one high temperature superconductor; and
   b. an irradiation assembly for irradiating electromagnetic energy in at least one of the radio frequency range and the microwave frequency range onto the at least one high temperature superconductor.
2. Switching element according to claim 1, wherein the electromagnetic energy has a frequency of 10 MHz to 800 MHz.

3. Switching element according to claim 2, wherein the frequency is less than 200 MHz.

4. Switching element according to claim 2, wherein the irradiating assembly outputs the electromagnetic energy in the form of at least one pulse.

5. Switching element according to claim 4, wherein the time length of the pulse is between 1 µs and 1 s.

6. Switching element according to claim 4, wherein the time length of the pulse is in the range of a few milliseconds.

7. Switching element according to claim 2, wherein the irradiation assembly comprises at least one coil arranged close to the at least one high temperature superconductor.

8. Switching element according to claim 7, wherein the coil is provided as a flat coil arranged on the high temperature superconductor.

9. Switching element according to claim 7, wherein the coil is manufactured from a superconducting material.

10. Switching element according to claim 2, wherein the electromagnetic energy has a frequency in the MHz-range.

11. Switching element according to claim 2, wherein the high temperature superconductor is provided as a thin layer of a high temperature superconductor.

12. Inverted rectifier for inverse rectifying a direct voltage of a direct current source, comprising:
   a. at least one first switching element according to claim 2;
   b. at least a second switching element according to claim 2, wherein
   c. the first and the second switching elements are arranged parallel to the direct current source and can be triggered in antiphase.

13. Inverted rectifier according to claim 12, wherein a transformer is arranged for decoupling the alternating voltage and wherein a primary coil of the transformer is thermally isolated from a secondary coil of the transformer.

14. Method for switching a high temperature superconductor comprising:
   a. providing the high temperature superconductor in it's a superconducting state; and
   b. irradiating the high temperature superconductor with electromagnetic energy in at least one of the radio frequency range and the microwave range until the high temperature superconductor switches into a normal conducting state.

15. Method according to claim 14, wherein the electromagnetic energy has a frequency in the MHz range.

16. Method according to claim 14, wherein the electromagnetic energy has a frequency of 10 MHz to 800 MHz.

17. Method according to claim 16, wherein the high temperature superconductor is a thin layer of a high temperature superconductor.

18. Method according to claim 16, wherein the electromagnetic energy is irradiated as one or more pulses.

19. Method according to claim 18, wherein the time length of the pulses is in the range of 1 µs to 1 s.

20. Method according to claim 16, wherein the frequency is less than 200 MHz.

21. Rectifier for rectifying an alternating current of an alternating current source comprising:
   a. at least one first switching element according to claim 2;
   b. at least a second switching element according to claim 2, wherein
   c. the first and the second switching elements are arranged parallel to a direct current output and can be triggered in antiphase.

22. Rectifier according to claim 21, wherein the alternating current source comprises a transformer and wherein a primary coil of the transformer is thermally isolated from a secondary coil of the transformer.

23. Magnetic energy storage comprising:
   a. a magnetic coil for storing energy;
   b. a switching element according to claim 2, wherein
   c. the switching of a switching element leads to a decoupling of the stored energy.

24. Magnetic energy storage according to claim 23, wherein the switching element is arranged as points for directing current in the normal conducting state to an external consumer.

25. Flow pump for loading an inductivity with current, comprising:
   a. means for providing an alternating voltage;
   b. a first and a second switching element according to claim 2, wherein
   c. the first and the second switching elements are arranged parallel to the inductivity and are alternatingly operable to stepwise increase the current in the inductivity.

26. Flow pump according to claim 25, wherein the means for providing an alternating voltage comprises a transformer and wherein a primary coil of the transformer is thermally isolated from a secondary coil of the transformer.

27. Flow pump according to claim 25, wherein the alternating voltage has a frequency of 20 Hz and a closing time of the switching elements is approximately 15 ms.

28. Current limiter for limiting a maximally allowed current in an electric circuit comprising:
   a. a switching element according to claim 2; and
   b. means for triggering the irradiation of electromagnetic energy in response to a detection that the maximally allowed current is exceeded.

29. Current limiter according to claim 28, wherein the switching element remains in a resistive state after triggering the irradiation.

30. Current limiter according to claim 28, further comprising means for cooling which brings the high temperature superconductor of the switching element into a superconducting state after turning off the electromagnetic irradiation.

* * * * *